(12) United States Patent
Rothacher

(10) Patent No.: US 8,242,569 B2
(45) Date of Patent: Aug. 14, 2012

(54) ENCAPSULATION, MEMS AND METHOD OF SELECTIVE ENCAPSULATION

(75) Inventor: Peter Rothacher, Bruchsal (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/055,987

(22) PCT Filed: Jun. 25, 2009

(86) PCT No.: PCT/EP2009/057994
§ 371 (c)(1),
(2), (4) Date: Jan. 26, 2011

(87) PCT Pub. No.: WO2010/012548
PCT Pub. Date: Feb. 4, 2010

(65) Prior Publication Data
US 2011/0121414 A1    May 26, 2011

(30) Foreign Application Priority Data
Jul. 28, 2008  (DE) .................. 10 2008 040 775

(51) Int. Cl.
*H01L 29/84* (2006.01)
(52) U.S. Cl. ................ 257/415; 257/744; 438/51
(58) Field of Classification Search .............. 257/704, 257/415; 438/51; 73/514.01
See application file for complete search history.

(56) References Cited

U.S. PATENT DOCUMENTS

| | | | |
|---|---|---|---|
| 5,410,789 A | 5/1995 | Noto et al. | |
| 5,831,369 A | 11/1998 | Fürbacher et al. | |
| 6,429,506 B1 | 8/2002 | Fujii et al. | |
| 6,984,421 B2 | 1/2006 | Pahl et al. | |
| 7,919,362 B2 * | 4/2011 | Bolis ........................ | 438/127 |
| 2004/0070603 A1 * | 4/2004 | Gerra et al. ................ | 345/738 |
| 2007/0007607 A1 * | 1/2007 | Sakai et al. ................ | 257/414 |
| 2009/0102003 A1 | 4/2009 | Vogt et al. | |

FOREIGN PATENT DOCUMENTS

| | | |
|---|---|---|
| DE | 10006446 | 8/2001 |
| DE | 102006019080 | 8/2007 |
| JP | 2003254988 | 9/2003 |

OTHER PUBLICATIONS

Chen et al., Design and Development of a Package Using LCP for RF/Microwave MEMS Switches, IEEE Transactions on Microwave Theory and Techniques, Nov. 1, 2006, pp. 4009-4015, vol. 54 No. 11, US LNKD-DOI: 1109/TMTT.2006.884639, XP011149887, ISSN: 0018-9480, IEEE Service Center, Piscataway, NJ, USA (7 pages).
Chen et al., Multilayer Organic Multichip Module Implementing Hybrid Microelectromechanical Systems, IEEE Transactions on Microwave Theory and Techniques, Apr. 1, 2008, pp. 952-958, vol. 56 No. 4, US LNKD-DOI: 10.1109/TMTT.2008.919642, XP011205832, ISSN: 0018-9480, IEEE Service Center, Piscataway, NJ, USA (7 pages).
Kingsley et al., Organic "Wafer-Scale" Packaged Miniature 4-bit RF MEMS Phase Shifter, IEEE Transactions on Microwave Theory and Techinques, Mar. 1, 2006, pp. 1229-1236, vol. 54 No. 3, US LNKD-DOI:10.1109/TMTT.2005.864099, XP001524258, ISSN: 0018-9480, IEE Service Center, Piscataway, NJ, USA (8 pages).
International Search Report corresponding to PCT Application No. PCT/EP2009/057994, mailed Nov. 2, 2010 (German and English language document) (7 pages).

* cited by examiner

*Primary Examiner* — Howard Weiss
*Assistant Examiner* — Steven Rao
(74) *Attorney, Agent, or Firm* — Maginot, Moore & Beck

(57) ABSTRACT

An encapsulation of a sensitive component structure on a semiconductor substrate with a film covering the component structure is disclosed. A cavity for the component structure is provided in the film. A MEMS and a method for encapsulating a sensitive component structure is also disclosed.

21 Claims, 2 Drawing Sheets

ENCAPSULATION, MEMS AND METHOD OF SELECTIVE ENCAPSULATION

BACKGROUND

The disclosure relates to encapsulation of a microelectromechanical system (MEMS) and a method for encapsulating a sensitive component structure on a semiconductor substrate.

Sensitive, mainly mechanical, component structures of MEMS have to be encapsulated for protection against damage. Inertial sensors, such as acceleration sensors or rate-of-rotation sensors, are currently covered with KOH-etched silicon caps, the caps being connected with the aid of a seal glass connection on the semiconductor substrate having the sensitive component structure. A further established method for encapsulating sensitive component structures on semiconductor substrates is the anodic bonding of three-dimensionally structured glass wafers. In addition, structured silicon wafers as encapsulation are fixed to semiconductor substrates by various bonding methods. What is common to all the aforementioned methods is that a cost-intensive, three-dimensionally structured cap composed of silicon or glass is used.

DE 100 06 446 A1 describes a method for encapsulating sensitive component structures in the wafer stage. The known encapsulation comprises a frame structure composed of a cured reaction resin, said frame structure enclosing the component structure, and also a planar cap consisting of a flat (two-dimensional), plastic film and a cured reaction resin layer arranged thereabove, said cap covering the frame structure and forming a hollow space with the latter. What is disadvantageous about the known encapsulation is the complex production method thereof using an alternative film that firstly has to be applied and then has to be removed again.

The disclosure addresses the problem of proposing an alternative, simple and cost-effective encapsulation for a component structure on a semiconductor substrate. Furthermore, the problem consists in specifying an MEMS comprising at least one encapsulation of this type, and also a production method for producing an encapsulated component structure.

The disclosure is based on the concept of not covering the hollow space surrounding the component structure with a two-dimensional film as in the prior art, but rather using, in order to protect the component structure against external influences, a film provided with at least one cavity for covering the component structure. In this case, the cavity forms the hollow space that protects the component structure. Depending on the constitution of the film, the film can be bonded either directly to the semiconductor substrate or to a coating provided on the semiconductor substrate, in particular a metallization. The central concept of the disclosure therefore consists in using a three-dimensionally structured or shaped film with which the component structure is covered and thus protected. In this case, it is particularly preferred if the three-dimensionally structured film, preferably having a multiplicity of cavities, is used as early as in the wafer stage during the production of MEMS in order thus to simultaneously encapsulate a multiplicity of sensitive, preferably mechanical, component structures of a multiplicity of MEMS. In this case, an embodiment of the encapsulation in which the component structure is a mechanical component structure, preferably of an inertial sensor, of a microphone (vibrating diaphragm) or of a pressure sensor (pressure diaphragm), is particularly advantageous. On account of the significantly reduced production costs, the encapsulation proposed is optimally suitable for consumer inertial sensors for use in handheld devices, so-called handhelds, such as mobile telephones, pocket PCs, etc. Furthermore, an encapsulation embodied according to the concept of the disclosure has great potentials with regard to thickness reduction and size reduction in comparison with the encapsulations known from the prior art.

With regard to the embodiment of the three-dimensionally structured film, that is to say the film provided with at least one cavity, there are various possibilities. Thus, it is conceivable for the film to be embodied as a monolayer polymer film, that is to say from a single material layer. Alternatively, the film can be embodied as a multilayer film, that is to say as a composite film comprising at least two identical or different layers. In this case, an embodiment in which at least one layer of the multilayer film is embodied as a polymer layer is particularly preferred. It goes without saying that a plurality of identical or different polymer layers can also be provided.

The monolayer polymer film or the at least one polymer layer of the film can be bonded either directly to the semiconductor substrate, for example by producing a polymer bonding connection, or to a coating provided on the semiconductor substrate, in particular a plastic coating or a thin film that chemically bonds the encapsulation to the MEMS substrate.

One development of the disclosure advantageously provides for the monolayer polymer film or the at least one polymer layer of the multilayer film, preferably the entire film, to have a dimensional stability at the temperatures occurring during the bonding of the film. Preferably, the dimensional stability under heat is intended still to be ensured at temperatures of greater than 230° C. In the case of temperature loading up to 230° C., for example, for a short period of time, the monolayer polymer film or the polymer layer should be substantially dimensionally stable.

One development of the disclosure advantageously provides for the monolayer polymer film or the at least one polymer layer of the film to have a lowest possible coefficient of expansion in order to avoid an impermissible deformation of the encapsulation and thus of the MEMS during subsequent use of the MEMS equipped with a corresponding encapsulation, even in the case of great temperature fluctuations. Preferably, the coefficient of expansion is less than 20 ppm/K, especially preferably less than 10 ppm/K.

Ideally, the monolayer polymer film or the polymer layer of the multilayer film, especially preferably the entire film, with regard to its coefficient of expansion, exhibits isotropic behavior in the x-direction and also in the y-direction. For this purpose, the monolayer polymer film or the polymer layer, especially preferably the entire film, can be biaxially oriented.

Polymer films, in particular for forming the polymer layer, having the properties mentioned are sold for example under the designation "Vectra 540i" by Ticona or under the designation "Zenite 6330 NC" by Dupont. Furthermore, the biaxially oriented films of the Vectra type (manufactured by Kuraray) are even available with coefficients of expansion of less than 5 ppm/K that are isotropic in the x- and y-directions.

It is particularly expedient if the monolayer polymer film or the at least one polymer layer consists of liquid crystal polymer (LCP), or at least comprises this compound. Liquid crystal polymer has liquid-crystalline properties in the melt (thermophobic) or in solution (lyotropic). LCP is extremely thermostable (dimensionally stable) and has a very low coefficient of expansion. A further advantage of LCP is that it is significantly more impermeable than a reaction resin such as is used in encapsulations from the prior art. Furthermore, it is possible for the monolayer polymer film or the at least one polymer layer to be formed from an Ormocer. Furthermore, it may be advantageous for the monolayer polymer film or the at least one polymer layer to be formed from polyether ether ketone (PEEK). The melting point thereof is 335° C. Polyether ether ketone is distinguished, in particular, by the fact that it is resistant to almost all organic and inorganic chemicals. It is also possible for the monolayer polymer film or the polymer layer to be formed from the following chemical polymer compounds: polyamide-imide (PAI) or polybenzimidazole (PBI), or polyvenylene sulfide (PPS) or polyaryl sulfone (PAS).

It is particularly expedient if the thickness of the film is less than 200 µm, preferably less than 150 µm. It is especially preferred if the film thickness is approximately 100 µm±10 µm, or less.

In order to hermetically seal the encapsulation, in particular with regard to gases and/or moisture, an embodiment is preferred in which the multilayer film having at least one polymer layer, preferably exclusively one polymer layer, comprises at least one metal layer. If the metal layer is provided on that side of the multilayer film which faces the semiconductor substrate, the metal layer permits facilitated bonding of the film to the semiconductor substrate or preferably to a coating provided on the semiconductor substrate, in particular a metallization, preferably by means of a soldering bonding method, a solid-liquid interdiffusion soldering method (SLID) or a thermocompression bonding method. When an SLID bonding process is taken as a basis, the bonding frame (metallization) provided on the semiconductor substrate can be made very small. The SLID bonding technique is distinguished by the fact that a layer of metal having a low melting point, for example tin, is applied between an upper and a lower layer composed of metal having a higher melting point, for example copper, and is melted at a low temperature. The metal having a higher melting point then diffuses into the upper and the lower layer, and in the process an alloy having a higher melting point forms and solidifies. Consequently, during further bonding/soldering processes, remelting of the connection is reliably prevented.

The hermetic sealing of the encapsulation can be improved even further if the film has at least two, preferably exclusively two, metal layers, wherein it is particularly preferred if the two metal layers form the two outermost layers of the film. Especially preferably, the two metal layers accommodate a polymer layer between them in a sandwich-like manner.

It is particularly preferred if the metal layer of the multilayer film has a high ductility (elongation at break). Furthermore, the metal layer should have a low coefficient of expansion, preferably of less than 17 ppm/K, and/or a melting point of, in particular significantly, greater than 240° C., preferably of greater than 300° C.

The metal layer, preferably having all of the properties mentioned above, can be formed from a multiplicity of metals, in particular from ductile copper, nickel, aluminum or high-grade steel, etc.

The abovementioned properties are fulfilled for example by copper-clad LCP films from Rogers. These films have been used heretofore for the production of flexible and multilayer printed circuit boards by Dyconnex.

One development of the disclosure advantageously provides for not only the polymer layer but the entire film to be biaxially oriented in order to ensure coefficients of expansion that are isotropic in the x- and y-directions.

With regard to the shaping of the cavity, there are various possibilities. Thus, it is conceivable to shape said cavity for example in curved (bent, roundish) fashion. In addition, angular or combined round/angular shapes can be realized. In this case, roundings have an increased stability and prevent an areal attachment and hence adhering of the active structures of the MEMS.

The at least one cavity can be introduced by injection molding, embossing, in particular injection-compression molding, thermoforming, deep-drawing or casting, wherein a stamping process can also be integrated into the aforementioned processes in order to produce cutouts for bonding pads in the encapsulation. Said cutouts can also be produced by means of downstream stamping processes, laser cutting or with lithographic processes of coupled etching methods (wet-chemical, plasma or in combination). During casting, the film polymer is poured into a mold and thereupon cured thermally or by UV irradiation.

It is especially preferred if the film has at least one end stop for protecting the encapsulated component structure. In this case, an end stop should be understood to mean a small-area elevation which projects in the direction of the component structure and which prevents the component structure from emerging to an excessively great extent or prevents the component structure from adhering to the cover.

Furthermore, the disclosure leads to a method for encapsulating a sensitive component structure on a semiconductor substrate comprising the following steps: providing a film having at least one cavity, relatively positioning the cavity (relative) to the component structure to be encapsulated, and bonding the film to the semiconductor substrate or a coating, preferably a bonding frame, in particular a metallization, of the semiconductor substrate. As a preceding step, provision is preferably made for shaping the cavity into the film. This can be done either directly during the process for producing the film, for example in the injection-molding method, or in a subsequent deformation step, in particular by deep-drawing and/or thermoforming.

It is especially preferred if the encapsulation is carried out as early as in the wafer stage of MEMS, such that a multiplicity of sensitive, preferably mechanical, component structures can be encapsulated simultaneously. For this purpose, a film which, in terms of its areal extent, preferably at least approximately corresponds to the areal extent of the wafer is positioned relative to the wafer, more precisely to the component structures provided on the wafer, whereupon the film is bonded to the wafer.

The bonding process is preferably followed by the division (separation) of the wafer (with film) into a multiplicity of separate MEMS, in particular inertial sensors, in which case it is possible to realize severing of the film and the semiconductor substrate simultaneously, for example by laser cutting, or of the film and the wafer successively, for example by the film being precut with the aid of a saw or a laser and the uncovered semiconductor substrate being severed in a subsequent step.

BRIEF DESCRIPTION OF THE DRAWINGS

Further advantages, features and details of the disclosure will become apparent from the following description of preferred exemplary embodiments and with reference to the drawings.

In the drawings.

DETAILED DESCRIPTION

In the figures, identical components and components having the same function are identified by the same reference signs.

Figure 1:
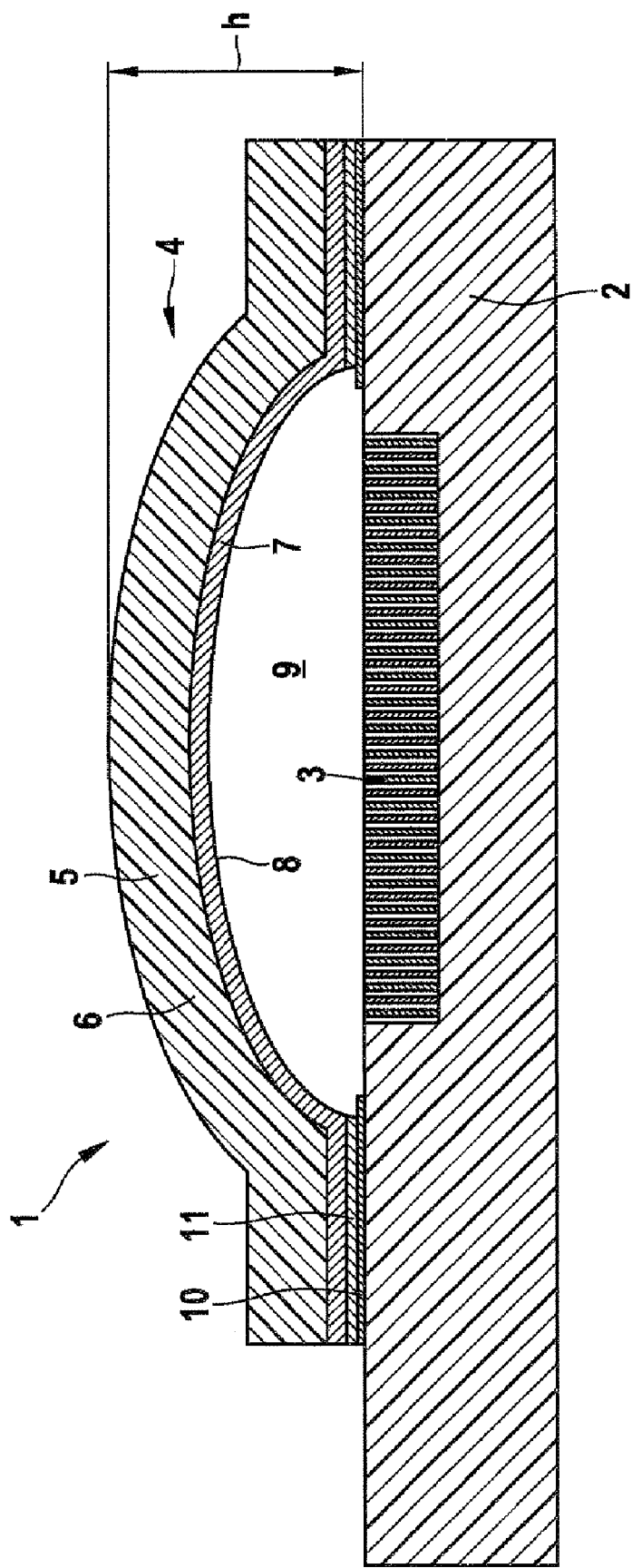
FIG. 1 shows a first exemplary embodiment of an encapsulation with a rounded cavity.

FIG. 1 shows an MEMS 1 (Microelectromechanical System). The MEMS 1 comprises a semiconductor substrate 2 with a sensitive, mechanical, component structure formed thereon, said component structure being formed from a semiconductor material. The component structure 3 is protected against mechanical and other environmental influences, such as temperature and moisture and also gas, by an encapsulation 4. The height h of the encapsulation 4 (measured perpendicularly to the areal extent of the semiconductor substrate 2) is approximately 200 μm in the exemplary embodiment. The encapsulation 4 is formed with the aid of a film 5 embodied as a multilayer film. Said film comprises a polymer layer 6, here composed of LCP, and also an outer metal layer 7, here composed of ductile copper, which faces the semiconductor substrate 2. The film 5 is distinguished by a three-dimensional structuring in the form of a cavity 8. The cavity 8 forms a hollow space 9 above the component structure 3.

In the exemplary embodiment shown, the film 5, which can alternatively have in addition to the single metal layer 7 here a further metal layer, arranged on that side of the polymer layer 6 which faces away from the metal layer 7, is bonded to a coating 10 (bonding frame) of the semiconductor substrate 2, said coating being embodied as a metallization. In order to realize the exemplary embodiment shown, the SLID bonding method was used in this case, wherein a thin tin layer 11 was deposited between the coating formed from copper and the metal layer 7—consisting of copper—of the film 5. This can be realized for example electrolytically, the CVD (chemical vapor deposition) or by PVD (physical vapor deposition). As an alternative to a thin tin layer 11 having a thickness of approximately 0.1 μm to approximately 5 μm, for example eutectic SnCu or SnAg can alternatively be deposited. Indium and gallium alloys can likewise be used. After the application of the thin tin layer 11, the film 5 for bonding purposes was pressed against the semiconductor substrate 2 (wafer) coated with the (copper) coating 10 in the bonding region and the temperature was raised above the melting point of the tin. In the process, the tin melted, and a bronze alloy having a higher melting point formed, which remains mechanically stable during subsequent soldering processes, in particular SND soldering processes.

As is evident from FIG. 1, the cavity 8 has a rounded shape. In order to increase the stiffness of the encapsulation 4, it is possible to increase the layer thickness of the metal layer 7, here the copper layer, in particular electrolytically. Thus, it is possible to deposit other metal or sandwich layers, for example Cu—Ni—Cu. Alternatively, it is conceivable, as already explained above, to use polymer layers clad with metal layers on two sides as multilayer films.

Figure 2:
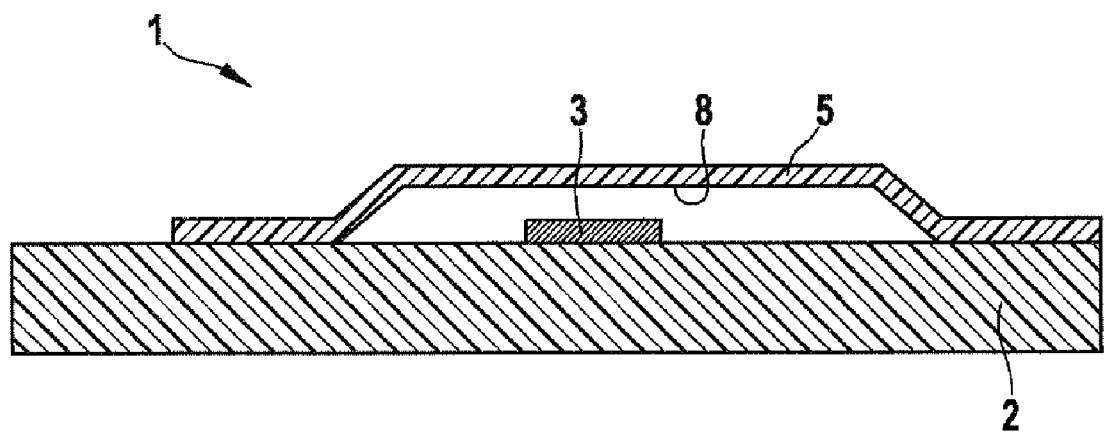
FIG. 2 shows an alternative exemplary embodiment, illustrated highly schematically, on an angularly shaped encapsulation.
Figure 3:
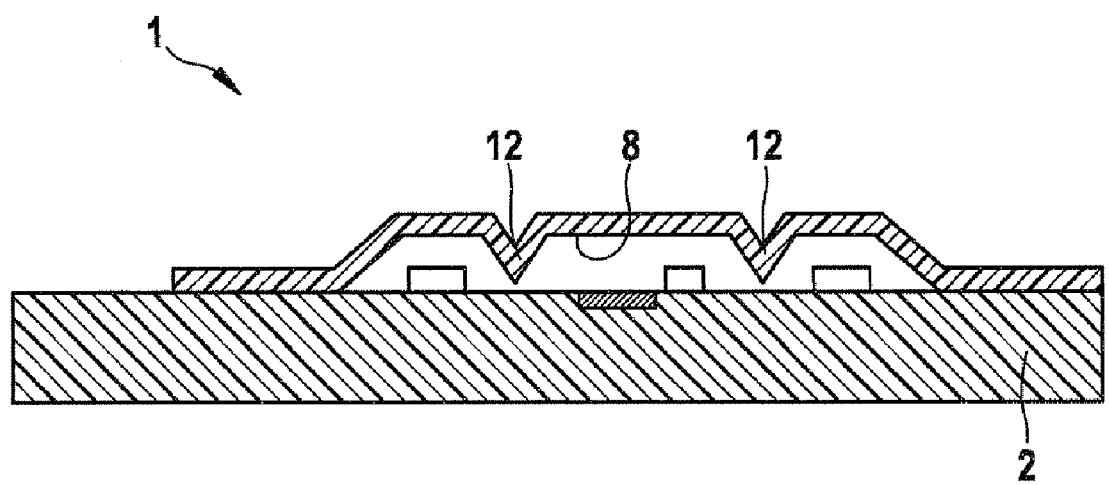
FIG. 3 shows a further alternative exemplary embodiment of a complexly shaped encapsulation.

As is evident from FIGS. 2 and 3, not only rounded cavities 8, but also angular and in part extremely complexly shaped cavities 8 can be realized. In the case of all cavity shapes, it is possible to realize the end stops 12 shown in FIG. 3 for the protection of the encapsulated component structures 3, here sensors.

The invention claimed is:

1. An encapsulation, comprising:
   a semiconductor substrate;
   a sensitive component structure supported by the semiconductor substrate; and
   a multilayer film covering the sensitive component structure, wherein a cavity is defined by the multilayer film and said cavity is positioned over the sensitive component structure,
   wherein the multilayer film includes at least one polymer layer having a first polymer layer side facing away from the semiconductor substrate and a second polymer layer side facing toward the semiconductor substrate; and
   wherein the multilayer film further includes a metal layer positioned on the second polymer layer side of the at least one polymer layer so that the metal layer faces toward the semiconductor substrate.

2. The encapsulation as claimed in claim 1, wherein:
   the semiconductor substrate includes a metallization, and
   the metal layer of the multilayer film is bonded to the metallization of the semiconductor substrate.

3. The encapsulation as claimed in claim 1, wherein the at least one polymer layer has a dimensional stability under heat at temperatures of around or greater than 230° C.

4. The encapsulation as claimed in claim 1, wherein the at least one polymer layer has a coefficient of expansion of less than 20 ppm/K.

5. The encapsulation as claimed in claim 1, wherein the at least one polymer layer has a length and a width, and with regard to the coefficient of expansion, exhibits isotropic behavior lengthwise and widthwise.

6. The encapsulation as claimed in claim 1, wherein the at least one polymer layer comprises at least one of LCP, Ormocers, PEEK, PAI, PBI, PPS, and PAS.

7. The encapsulation of claim 1, wherein the at least one polymer layer has a film thickness less than approximately 100 μm.

8. The encapsulation as claimed in claim 1, wherein:
   the semiconductor substrate includes a base and a metallization supported by the base, and
   the metal layer is bonded to the metallization by soldering bonding, solid-liquid interdiffusion bonding (SLID), or thermocompression bonding.

9. The encapsulation as claimed in claim 8, wherein the metal layer has a ductility greater than 10%.

10. The encapsulation as claimed in claim 9, wherein the metal layer has a melting point of greater than 300° C.

11. The encapsulation as claimed in claim 10, wherein the metal layer comprises one or more of copper, nickel, aluminum, and high-grade steel.

12. The encapsulation as claimed in claim 1, wherein the multilayer film is biaxially oriented.

13. The encapsulation as claimed in claim 1, wherein the cavity is rounded and/or angularly shaped.

14. The encapsulation as claimed in claim 1, wherein the cavity is configured by injection molding, embossing, injection-compression molding, thermoforming, deep-drawing, or casting.

15. The encapsulation as claimed in claim 1, wherein:
   the film has at least one end stop configured to protect the component structure; or
   the cavity is rounded so as to prevent adhering of the component structure.

16. The encapsulation of claim 1, wherein the encapsulation is a MEMS, the sensitive component structure comprising:
   an inertial sensor,
   a pressure sensor,
   a micromirror, or
   a microphone.

17. A method for encapsulating a sensitive component structure between a multilayer film and a semiconductor substrate, with the multilayer film defining a cavity and including a polymer layer and a metal layer, and with the semiconductor substrate including a metallization, comprising:
positioning the multilayer film so that (i) the cavity is positioned in alignment with the sensitive component structure, and (ii) the metal layer faces toward the semiconductor substrate; and
bonding the metal layer of the multilayer film to the metallization of the semiconductor substrate.

18. The method as claimed in claim 17, wherein:
the semiconductor substrate is a wafer;
the multilayer film includes a multiplicity of cavities; and
the multilayer film is bonded to the semiconductor substrate so that the multiplicity of cavities are positioned over the semiconductor substrate.

19. The method as claimed in claim 18, wherein the wafer is subdivided into a multiplicity of separate MEMS after encapsulation.

20. The encapsulation as claimed in claim 1, wherein:
the metal layer includes (i) a first metal layer side facing away from the semiconductor substrate, and (ii) a second metal layer side facing toward the semiconductor substrate, and
the first metal layer side is juxtaposed to the second polymer layer side.

21. The method as claimed in claim 17, wherein:
the polymer layer includes (i) a first polymer layer side facing away from the semiconductor substrate, and (ii) a second polymer layer side facing toward the semiconductor substrate,
the metal layer includes (i) a first metal layer side facing away from the semiconductor substrate, and (ii) a second metal layer side facing toward the semiconductor substrate, and
the first metal layer side is juxtaposed to the second polymer layer side.

* * * * *